United States Patent
Trivedi et al.

(10) Patent No.: US 8,373,470 B2
(45) Date of Patent: Feb. 12, 2013

(54) MODULAR PROGRAMMABLE DELAY LINE BLOCKS FOR USE IN A DELAY LOCKED LOOP

(75) Inventors: Pradeep R. Trivedi, Saratoga, CA (US); Vincent R. von Kaenel, Palo Alto, CA (US)

(73) Assignee: Apple Inc., Cupertino, CA (US)

( * ) Notice: Subject to any disclaimer, the term of this patent is extended or adjusted under 35 U.S.C. 154(b) by 152 days.

(21) Appl. No.: 12/901,778

(22) Filed: Oct. 11, 2010

(65) Prior Publication Data

US 2012/0086485 A1  Apr. 12, 2012

(51) Int. Cl.
*H03L 7/06* (2006.01)
(52) U.S. Cl. ......................................... 327/158; 327/149
(58) Field of Classification Search .................. 327/149, 327/158
See application file for complete search history.

(56) References Cited

U.S. PATENT DOCUMENTS

| | | | |
|---|---|---|---|
| 6,970,047 B1 | 11/2005 | Johnson | |
| 7,028,206 B2 | 4/2006 | Waller | |
| 7,034,589 B2 | 4/2006 | Chao | |
| 7,084,682 B2 * | 8/2006 | Jeon et al. | 327/158 |
| 7,456,665 B2 * | 11/2008 | Hinz et al. | 327/158 |
| 7,573,307 B2 | 8/2009 | Heragu | |
| 7,733,149 B2 * | 6/2010 | Delage et al. | 327/270 |
| 2005/0068110 A1 | 3/2005 | Hui et al. | |
| 2005/0140416 A1 | 6/2005 | Rashid | |
| 2006/0091927 A1 * | 5/2006 | Jin | 327/284 |
| 2007/0069791 A1 * | 3/2007 | Chae | 327/261 |
| 2008/0309392 A1 * | 12/2008 | Warren | 327/284 |
| 2008/0310571 A1 * | 12/2008 | Warren | 375/360 |
| 2009/0309638 A1 * | 12/2009 | Delage et al. | 327/158 |
| 2010/0052753 A1 * | 3/2010 | Shibayama et al. | 327/161 |
| 2010/0102863 A1 * | 4/2010 | Kojima | 327/158 |
| 2010/0201418 A1 * | 8/2010 | Delage et al. | 327/161 |
| 2010/0213991 A1 | 8/2010 | Fukuda | |
| 2012/0086484 A1 * | 4/2012 | Trivedi et al. | 327/158 |
| 2012/0086485 A1 * | 4/2012 | Trivedi et al. | 327/158 |

OTHER PUBLICATIONS

U.S. Appl. No. 12/901,745 titled "Delay Locked Loop Including a Mechanism for Reducing Lock Time" filed Oct. 11, 2010.

* cited by examiner

*Primary Examiner* — Adam Houston
(74) *Attorney, Agent, or Firm* — Lawrence J. Merkel; Stephen J. Curran; Meyertons, Hood, Kivlin, Kowert & Goetzel, P.C.

(57) ABSTRACT

Modular delay line blocks include a plurality of delay elements, each including a delay unit, an input, an output, a next element output, and an element return path. The delay elements are coupled together in a chain between a block input and a block output. The block input is coupled to the input of a first element in the chain and the block output is coupled to the output of the first element. In addition, the next element output of the first element is coupled to the element input of a next element in the chain, and the element output of the next delay element is coupled to the element return path of a previous element in the chain. In response to a selection control signal, each element may selectively route a signal from the element input to one of the next element output or to the element output.

15 Claims, 5 Drawing Sheets

006
MODULAR PROGRAMMABLE DELAY LINE BLOCKS FOR USE IN A DELAY LOCKED LOOP

BACKGROUND

1. Technical Field

This disclosure relates to delay locked loop circuits, and more particularly to the delay lines used in delay locked loops.

2. Description of the Related Art

A delay locked loop (DLL) may be implemented using either digital or analog circuits. A typical conventional digital implementation includes a delay line formed using a long series chain of inverters. The delay line may be tapped at many nodes along the chain such as between every other inverter, for example. These taps may be fed into multiplexer. Since there may be a large number of taps, they may be fed into a fairly wide multiplexer that selects the tap, and thus the desired delay. Many of these wide multiplexers are implemented using a hierarchical structure with four or more levels. Accordingly, due to the multi-level hierarchical structure of the multiplexer, the minimum delay of the delay line may be dominated by the multiplexer and unacceptably high. Furthermore, the integrated circuit die area used by conventional delay line structures can be quite large.

SUMMARY

Various embodiments of modular delay line blocks for use in a delay locked loop are disclosed. Broadly speaking a plurality of modular delay blocks may be coupled together to form a delay line. Each delay block may be programmed to have a delay that falls within a minimum and a maximum delay. Each delay block may itself include a plurality of delay elements that are programmable. The delay elements are also coupled together in a chain between the delay block input and the delay block output.

In one embodiment, a delay device or block includes a plurality of delay elements, each including a delay unit, an element input, an element output, a next element output, and an element return path. The delay elements may be coupled together in a chain between a device input such as the delay line input and a device output (e.g., the delay line output) such that the device input is coupled to the element input of a first delay element in the chain and the device output is coupled to the element output of the first delay element. In addition, the next element output of the first delay element is coupled to the element input of a next delay element in the chain, and the element output of the next delay element is coupled to the element return path of a previous delay element in the chain. The delay device also includes a decoder unit that may be configured to provide a respective selection control signal to each of the delay elements based upon a received delay control signal. Further, in response to the respective selection control signal, each delay element may be configured to selectively route a signal from the element input to one of the next element output or to the element output.

In one implementation, the next element output of a last delay element in the chain may be coupled to the element return path of the last delay element in the chain to complete a loop back through the delay elements.

In another embodiment, each delay element may include a decoder unit configured to provide respective control signals to route signals within the delay element based upon a received selection signal. The decoder unit may be configured to provide a first respective control signal to route a signal received at a first input to a first output through a logic gate in response to a first particular received selection signal, and to provide a second respective control signal to route to a second output a signal received at a second input in response to the first particular received selection signal. Each delay element may also include a delay unit that may be configured to provide a delayed version of the signal received at the first input, wherein an amount of delay is selectable by a third respective control signal received from the decoder unit. The decoder may also be configured to provide a fourth respective control signal to route to the second output the delayed version of the signal received at the first input in response to a second particular received selection signal.

Figure 1:
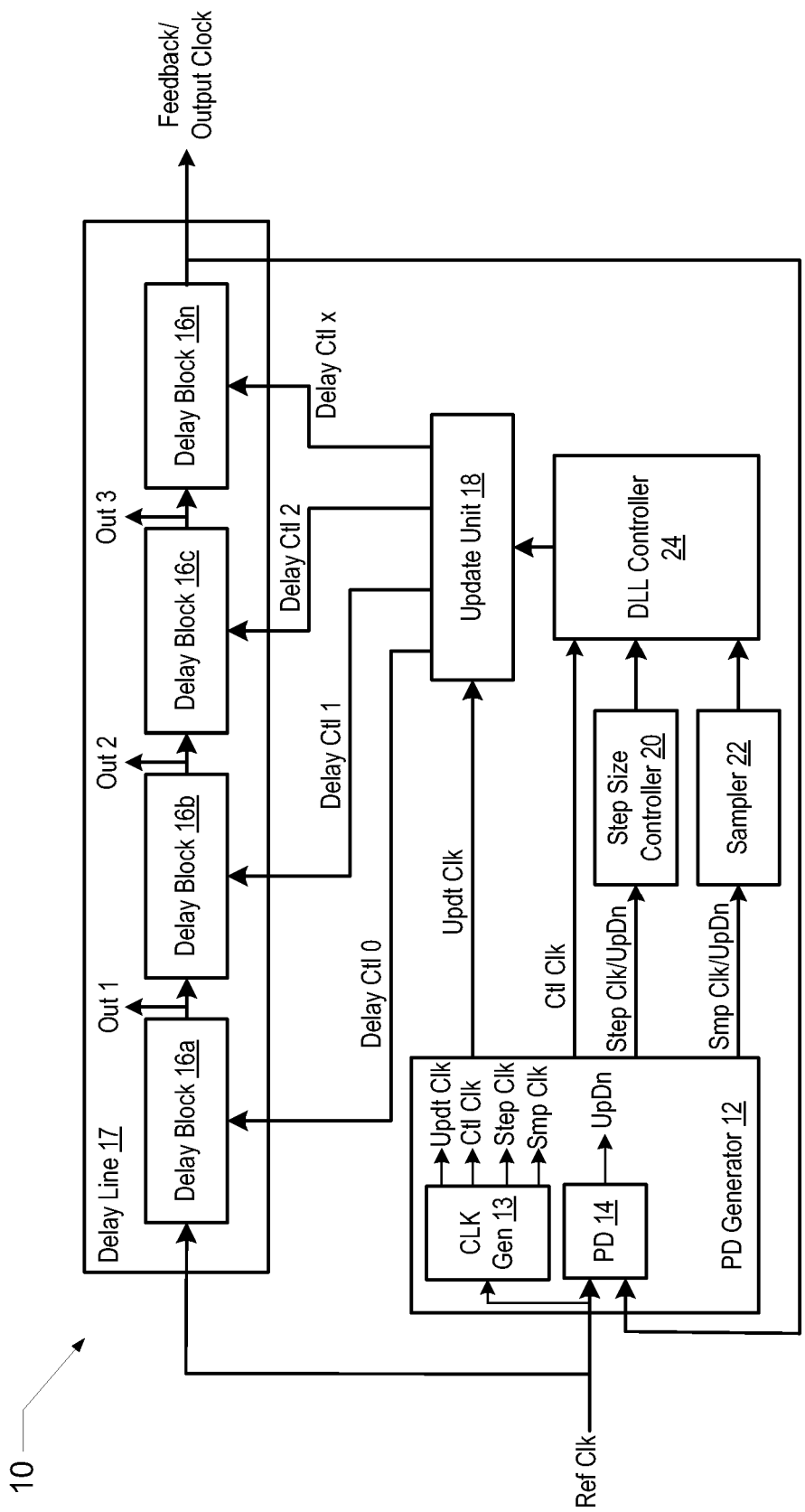
FIG. 1 is a block diagram of one embodiment of a delay locked loop unit.

Specific embodiments are shown by way of example in the drawings and will herein be described in detail. It should be understood, however, that the drawings and detailed description are not intended to limit the claims to the particular embodiments disclosed, even where only a single embodiment is described with respect to a particular feature. On the contrary, the intention is to cover all modifications, equivalents and alternatives that would be apparent to a person skilled in the art having the benefit of this disclosure. Examples of features provided in the disclosure are intended to be illustrative rather than restrictive unless stated otherwise.

As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six, interpretation for that unit/circuit/component.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

DETAILED DESCRIPTION

Turning now to FIG. 1, a block diagram of one embodiment of a delay locked loop (DLL) circuit is shown. The DLL 10 includes a phase detector generator designated PD generator 12, which is coupled to a DLL controller 24, a sampler 22, a step size controller 20 and an update unit 18. The update unit is coupled to a delay line 17 that includes a number of delay blocks designated 16a through 16n, where n is meant to represent that there may be any number of delay blocks. The PD generator 12 is coupled to receive a reference clock (e.g., Ref Clk) and an output clock or "feedback clock," while the left most delay block 16a is also coupled to receive the Ref Clk signal. It is noted that components having a reference designator with a number and a letter may be referred to by the number only where appropriate.

In the illustrated embodiment, the PD generator 12 includes a phase detector (PD) 14 and a CLK gen unit 13. As will be described in greater detail below in conjunction with the description of FIG. 4A and FIG. 4B, the CLK gen unit 13 is configured to generate a number of non-overlapping clocks for use by the various components in the DLL 10.

In one embodiment, the PD 14 is configured to receive the feedback clock from the delay block 16n and the Ref Clk, compare the phase relationship between the two clocks, and internally produce an error signal that is proportional to the phase difference between the two clocks. The PD 14 may then provide an up or down signal (e.g., UpDn) that may indicate whether the delay associated with the delay line should be increased or decreased so that the phase difference between the Ref Clk and the feedback clock is minimized. For example, if the leading edge of the Ref Clk signal is leading the leading edge of feedback clock signal by an amount up to 50% of the duty cycle, the PD 14 may provide an Up signal indicating that an increase in the delay of the delay line is needed to reduce the phase difference. Conversely, if the leading edge of the Ref Clk signal is lagging the leading edge of feedback clock signal by an amount up to 50% of the duty cycle, the PD 14 may provide a Dn signal indicating that a decrease in the delay of the delay line is needed to reduce the phase difference.

In the illustrated embodiment, the delay line 17 provides a variable phase delay of the Ref Clk input. In one embodiment, each of the delay blocks 16 may be independently programmed to have a particular delay. As will be described in greater detail below in conjunction with the descriptions of FIG. 2 and FIG. 3, each delay block 16 may include a number of independently controlled modular delay elements. As shown, each delay block 16 may produce a delayed version of the Ref Clk signal, such that the delay is cumulative from output tap Out 1 to feedback clock. More particularly, in one embodiment, the delay line 17 may be programmed using the delay control (e.g., delay ctl 0–delay ctl x) signals to produce a desired phase delay with a fine granularity. In addition, as described further below, each of the delay blocks 16 may be programmed to have a particular delay, such as substantially the same delay so that there is a balanced distribution of the total delay across all the delay blocks 16, for example.

In one embodiment, the update unit 18 may be configured to provide the control signals to the delay blocks 16 in a synchronous manner so that all the delay blocks receive their respective control values substantially simultaneously, or as close to the same time as possible. More particularly, the DLL controller 24 may provide the delay control signals (i.e., delay values) to the update unit 18, and the update unit 18 may be configured to output the delay ctl signals to the delay blocks 16 on a particular Updt clock edge. Each delay ctl signal may be an encoding, and thus in one embodiment, the delay ctl signal may be a multi-bit signal. In one embodiment, the update unit 18 may include some type of internal storage (e.g., register, RAM, etc.) to store the delay values sent by the DLL controller 24. In one embodiment, upon receiving an Updt Clk, the update unit 18 may send the delay values from the storage to the respective delay blocks 16 in response to the Updt Clk signal.

The step size controller 20 may be configured to receive the Up/Dn signal from the PD 14 and the Step Clk from the CLK Gen unit 13. In one embodiment, the step size controller 20 may be configured to provide a step size indication to the DLL controller 24 to control the step size of the delay line 17. As used herein, the step size may refer to the incremental total delay added to the Ref Clk signal by the delay line 17 as measured at the feedback clock signal. Thus, the step size indication indicates the size of the delay to be provided by the delay line 17. As an example, if the minimum possible delay through the delay line 17 is 40 ps, one step would be equivalent to 40 ps. Thus each time the step size controller 20 increments or decrements the delay step size, it may do so in increments of 40 ps. Thus, in the example, if the step size controller 20 indicates a step size of 16, the total delay would be 16*40 ps=640 ps. However, as described further below, each of the delay blocks 16 may be programmed to have a range of delay values. Thus, any step size within the programmed minimum and maximum may be used.

In one embodiment, the DLL 10 may use a different step size during an initial or coarse lock acquisition, than when the DLL 10 is close to being locked and a finer lock acquisition delay step size may be more appropriate. For example, upon initialization the step size controller 20 may be configured to use one or more larger step sizes (e.g., 16 steps) while the DLL 10 is trying to acquire the edge of the Ref Clk, and one or more smaller step sizes (e.g., one step) once the DLL 10 has found the Ref Clk edge and is close to lock acquisition. However, in other embodiments any number of delays, and thus any step size may be used, and in some embodiments there may be several different step sizes used during an acquisition. More particularly, it may be possible to use different numbers of delays between acquisition and lock. For example, the step size controller may use 16 delays for the first couple of Up signals, and upon receiving continued Up signals, the step size controller 20 may use smaller step sizes so that there is a gradual decrease in step size until the Ref Clk edge is found, and then an even smaller step may be used until lock is achieved.

In one embodiment, the sampler 22 may be configured to store the three most recent Up/Dn signals from the PD unit 14. More particularly, to avoid jitter, the sampler 22 may compare each received Up/Dn signal with a previous Up/Dn signal and a next Up/Dn signal to determine whether there is a lock condition. For example, if the current Up/Dn signal is an Up signal, the previous Up/Dn signal is a Dn signal, and the next Up/Dn signal is an Up signal, the sampler 22 may determine that the phase is locked because the PD 14 is alternating between Up and Dn. As such, in one embodiment, the sampler 22 may provide an indication such as a null signal, for example, to the DLL controller 24 to not change the delay control values. In another embodiment, the sampler 22 may be configured to provide to the DLL controller 24 one of the Up signal, the Dn signal or a null signal, which indicates not to change the delay control values.

The DLL controller 24 may be configured to control the operation of the DLL 10. More particularly, in one embodiment, the DLL controller 24 may determine the delay control values and provide those delay values to the update unit 18. The delay control values may be a single encoded value or a set of encodings (one for each delay block 16). The DLL controller 24 may use the Up/Dn signal to increase or decrease the amount of delay provided by the delay line 17.

In one embodiment, the DLL controller 24 may be configured to calculate delay values for each of the delay blocks 16 such that the total delay through the delay line 17 is distributed among the delay blocks 16 to have a particular distribution as desired. In one implementation, the total delay may be distributed such that the delay provided by each delay block 16 is substantially the same. For example, assume there are eight delay blocks 16 (e.g., 16a-16h). If there is initially no delay, and the DLL controller 24 receives signals that indicate delay needs to be added, rather than simply increasing the delay of delay block 16a, the DLL controller 24 may instead choose delay block 16d. Each time additional delay is added to the delay line, DLL controller 24 may select the delay blocks that will be used such that the delay is distributed. For example, if another delay is to be added, rather than just increasing delay block 16d, the DLL controller 24 may minimize the delay through block 16d, and increase the delay through delay blocks 16b and 16g. To continue the example, if a third delay were added, the DLL controller 24 may increase the delay through delay blocks 16d. Thus, the delay is continually distributed throughout the delay line 17.

Figure 2:
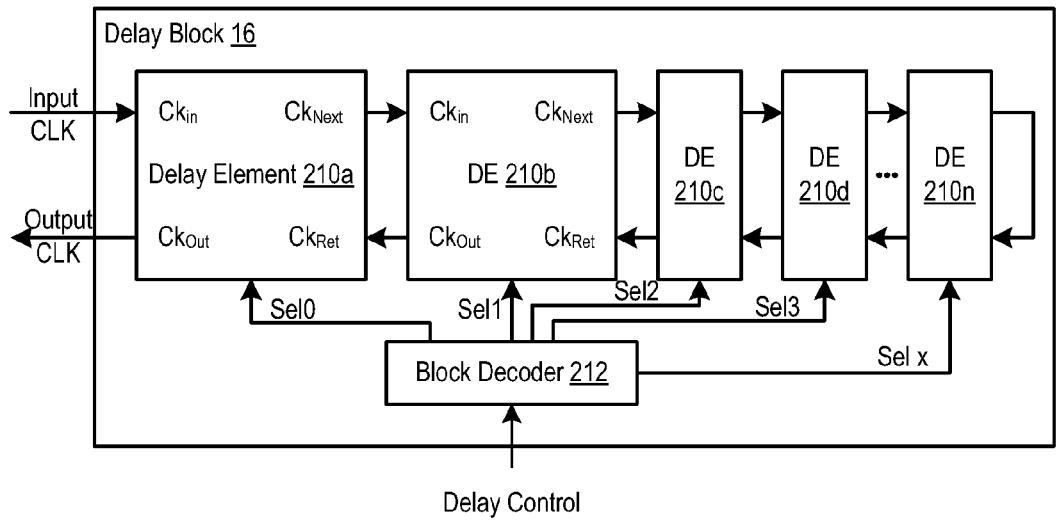
FIG. 2 is a block diagram of one embodiment of a delay block shown in FIG. 1.

Turning to FIG. 2, a block diagram of one embodiment of a delay block of FIG. 1 is shown. Delay block 16 includes a number of delay elements which are designated DE 210a through DE 210n. The delay block 16 also includes a block decoder 212 that is coupled to each delay element 210. It is noted that although there are five delay elements shown, n may be representative of any number of delay elements.

As shown in FIG. 2, the delay block 16 is configured to receive an input clock signal (e.g., input CLK), and a delay control signal. The delay block 16 is also configured to provide an output clock signal (e.g., output CLK) that is a delayed version of the input clock signal. The amount of delay depends on the path taken through the delay elements 210. The delay elements 210 are shown coupled together in a chain such that the Cknext output of each element is coupled to the Ckin input of the next element, and the Ckout output of one element is coupled to the Ckret input of a previous element. In the last element in the chain (e.g., element 210n), the Cknext output is coupled to the Ckret input in a loopback configuration.

The block decoder 212 is configured to receive and decode the delay control signal sent by the update unit 18 of FIG. 1. As mentioned above, the delay control signal may be a multi-bit encoding that may be decoded by the block decoder 212 and provided to each delay element 210 as a selection signal. As described in greater detail below in conjunction with the description of FIG. 3, each selection signal may be a multi-bit signal. In one embodiment, the selection signal is also encoded and controls the path through a delay element 210. For example, the selection signal controls whether a delay element 210 passes the input clock through to the Cknext output and passes the Ckret input through to the Ckout output, or whether a delay element 210 passes the input clock through an internal delay and to the Ckout output.

Figure 3:
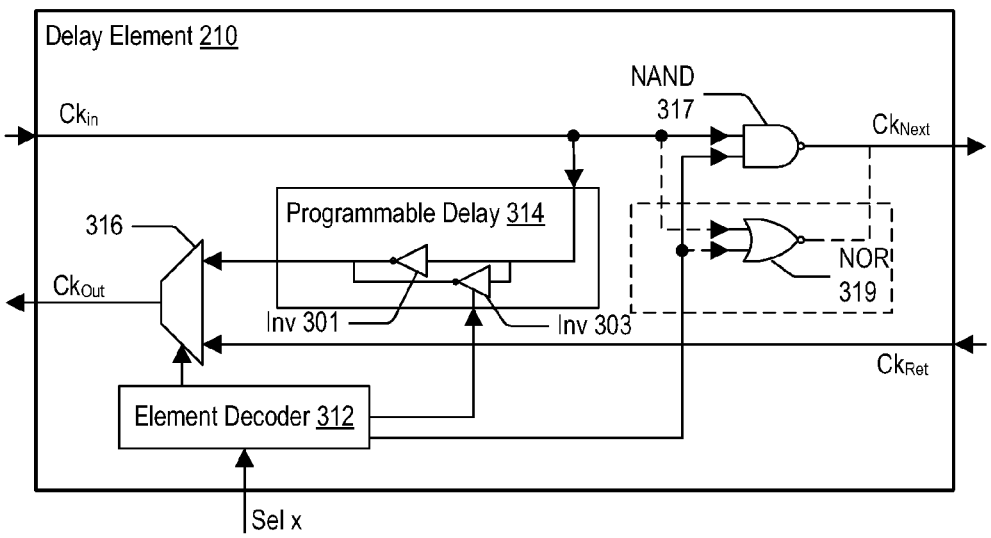
FIG. 3 is a block diagram of one embodiment of a delay element shown in FIG. 2.

Referring to FIG. 3, a block diagram of one embodiment of a delay element of FIG. 2 is shown. The delay element 210 includes an element decoder 312 that is coupled to a multiplexer (mux) 316, a programmable delay 314, a NAND-gate 317, and a NOR-gate 319. However, as described further below only one of the NAND-gate 317 or the NOR-gate 319 is used in a given delay element 210 during operation as indicated by the dashed line box and the dashed line connection from the input Ckin to the NOR-gate 319. In one embodiment, the delay element 210 may be a design library cell that includes both gate types, while in other embodiments, the delay element 210 may be a cell having only one type of gate.

The element encoder 312 is configured to decode the selector signal (e.g., Sel x) received from the block decoder 212 shown in FIG. 2 and to provide corresponding control signals to the components within the delay element 210. In response to receiving the Sel x signal, the element decoder 312 is configured to select the signal path through the delay element 210.

More particularly, depending on the desired delay of each delay block 16, the Input CLK signal may be routed through one or more of the delay elements 210 that are chained together. As such some of the delay elements may be configured to pass the clock signal through to the next delay element 210 in the chain, and one of the delay elements 210 may be configured to provide an internal delay and route the clock signal back through the chain to the Output CLK of the delay block 16. For example, if a particular delay block 16 is required to have a delay that is greater than the minimum delay of delay element 210a, then some number of the delay elements 210 may be configured to pass the clock signal through to the next delay element. Accordingly, if a particular delay element (e.g., 210a) is to be chained to a next element (e.g., 210b), then the signal path through the delay element 210a would pass the Ckin clock through the logic gate to the Cknext output. As such, the element encoder 312 may provide a logic value of one to enable the NAND-gate 317 (in embodiments with a NAND-gate), or a logic value of zero to enable the NOR-gate 319 (in embodiments with a NOR-gate). In addition, the element encoder 312 may cause the mux 316 to select the Ckret input as the Ckout path. In this configuration, the delay associated with delay element 210a would be either a NAND-gate or NOR-gate delay, and a mux delay. Depending on how many delay elements 210 are needed for the required delay, one of the delay elements will serve as the last element in the chain. If that last element is the last physical delay element in the chain (e.g., 210n) it would be configured as described above, and the Cknext output would be coupled to the Ckret input in a loop back, as shown in FIG. 2.

However, if the last element is instead delay element 210d, for example, delay element 210d will be configured to route the clock signal from the Ckin to the Ckout through the programmable delay 314. For example, the signal path through the delay element 210d would pass the Ckin clock through the programmable delay 314 to the Ckout output. As such, the element encoder 312 may cause the mux 316 to select the output of the programmable delay 314 as the Ckout path.

In addition, the element encoder 312 may provide an output to select the amount of delay provided by the programmable delay 314. As shown, the programmable delay 314 includes a pair of parallel coupled inverters, one of which having a selectable high impedance output mode. Further, to save power the encoder 312 may provide the appropriate gating signal to either the NAND-gate 317 or the NOR-gate 319 to gate the Cknext clock signal and thereby prevent unnecessary toggling within the unused delay elements further in the chain. Thus, this combination would selectably yield either a delay of either one inverter, or the delay associated with the parallel path through the inverter pair. Accordingly, in this configuration, the minimum delay through the delay element 210 would be one mux delay and the delay through the parallel inverter path, which can be very small (i.e., a few picoseconds).

Accordingly, when a delay block 16 requires a minimum delay element, delay element 210a would be configured to use the programmable delay output, and if a maximum delay is needed, all the delay elements may be used, and the clock signal may be looped back externally at the end of the chain on delay element 210n. It is noted that in other embodiments, other combinations of gates may be used to provide varying amounts of delay within programmable delay 314.

As mentioned above each delay element 210 will use either a NAND-gate 317 or a NOR-gate 319 to gate the Cknext signal. It is noted that it may be beneficial to alternate using delay elements that use the NAND-gate 317 and delay elements that use the NOR-gate 319 in the chain of delay elements to avoid glitching in the output clock when the clock routing is changed to add delay elements 210 to the chain.

Figure 4A:
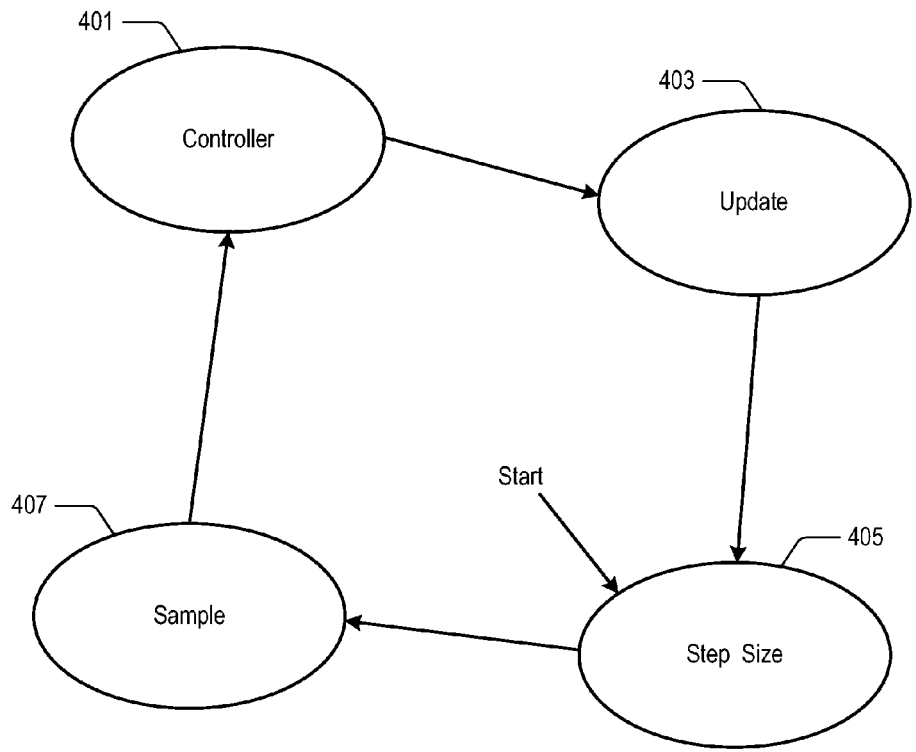
FIG. 4A is a state diagram illustrating the different operational states of particular portions of an embodiment of the delay locked loop shown in FIG. 1.
Figure 4B:
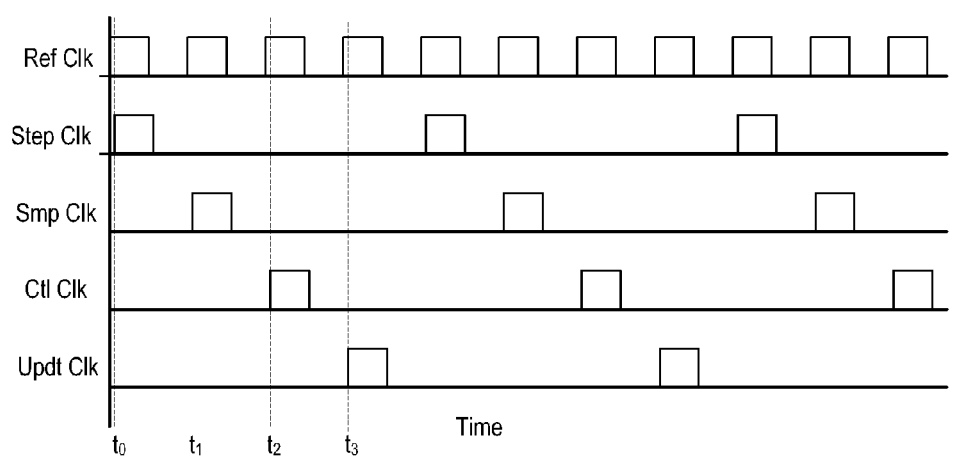
FIG. 4B is a timing diagram illustrating non-overlapping clocks used to clock portions of an embodiment of the delay locked loop shown in FIG. 1 and FIG. 4A.

As described above, the CLK gen unit 13 is configured to provide non-overlapping clocks to various components in the DLL 10. More particularly, as shown in FIG. 1, the CLK gen unit 13 provides an Updt Clk, a Step Clk, a Smp Clk, and a Ctl Clk for the update unit 18, step size controller 20, the sampler 22, and the DLL controller 24, respectively. As shown in FIG. 4A and FIG. 4B, each of these components operates in a non-overlapping fashion. FIG. 4A is a state diagram that depicts the non-overlapping operation of one embodiment of the DLL 10, while FIG. 4B is an exemplary timing diagram that illustrates the clock generation timing of one embodiment of the DLL 10 of FIG. 1.

Turning to FIG. 4A, the state diagram includes the DLL controller state 401, the Sample state 407, the Update state 403, and the Step size state 405. As shown, each of the DLL controller 24, the update unit 18, the step size controller 22, and the sampler 20 has a corresponding operational state. In one embodiment, each state may be entered from only one state, and may be exited to only one other state with the exception of the Step size state 403, which may also be entered from an initialization or start. Accordingly, when the step size controller 20 is operating, the DLL controller 24, the update unit 18, and the sampler 22 are not. Likewise for each of the other components.

Referring to FIG. 4B, the timing diagram shows four clock signals generated by the CLK gen unit 13 of the PD generator 12, with the input Ref Clk signal on the top. The next clock is the Step Clk, followed by the Smp Clk, followed by the Ctl Clk, and then the Updt Clk. As shown, the Step Clk is generated at time t0 for one clock cycle. During that cycle no other clocks are generated, and thus, the components that use those clocks are not operating, as described above. During time t1, the Smp Clk is active, while the other clocks are not, and so forth for the remaining clocks. The non-overlapping of the clocks may timing restrictions that may normally be imposed on conventional DLL circuits.

Figure 5:
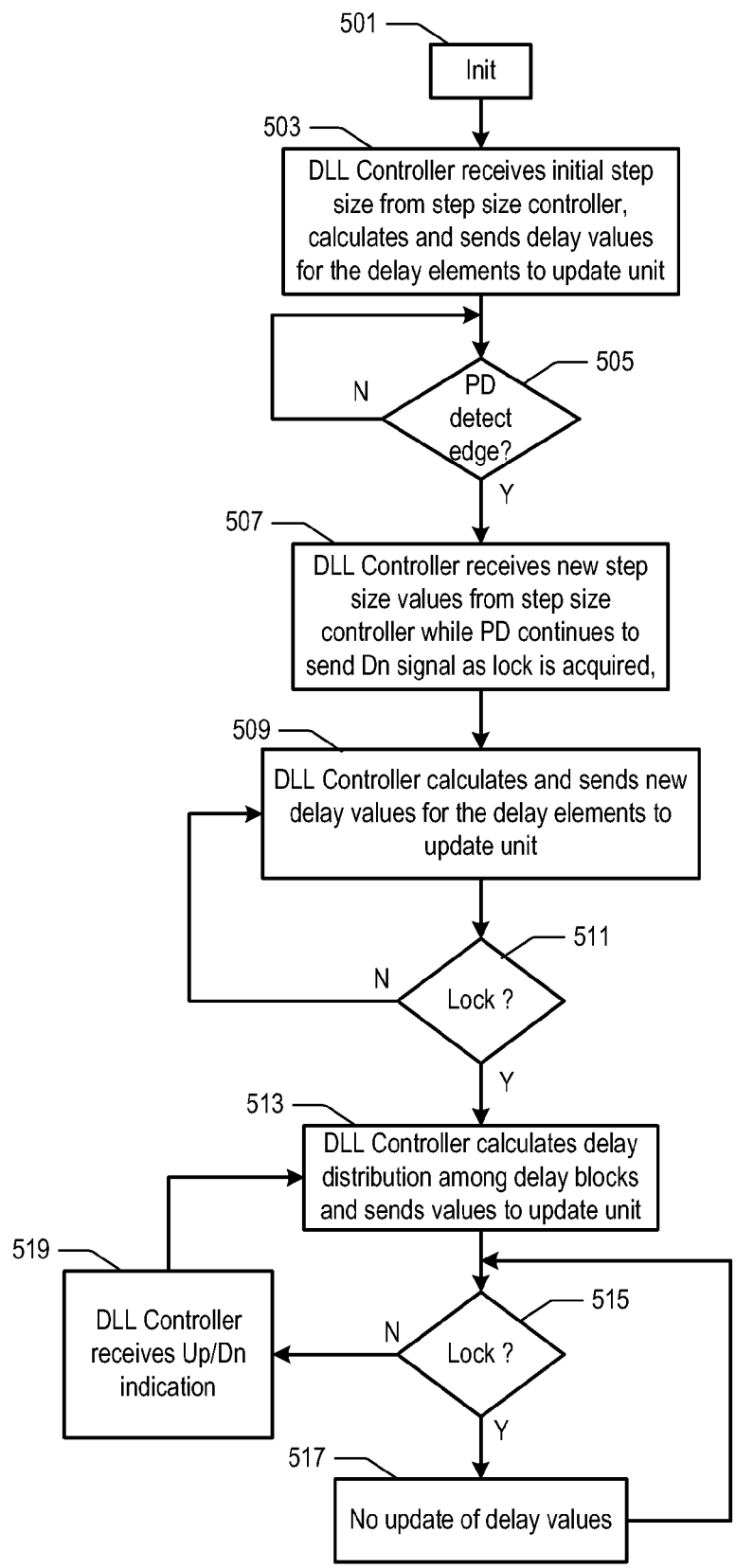
FIG. 5 is a flow diagram describing operational aspects of the delay locked loop shown in FIG. 1.

FIG. 5 is a flow diagram that describes operational aspects of the delay locked loop shown in FIG. 1. Referring collectively to FIG. 1 through FIG. 5 and beginning in block 501 of FIG. 5, during an initialization of the DLL, the DLL controller 24 may receive an initialization step size from the step size controller 20 as described above. The DLL controller 24 may, based upon the step size information, set the delay values for the delay elements 210 and provide the delay values to the update unit 18 (block 503). Once the update unit is clocked, the delay values may be synchronously sent to the delay blocks 16 of the delay line 17. Since the DLL 10 is not yet locked, in one embodiment, the PD 14 may be configured to provide an Up signal to increase the delay until the Ref Clk leading edge passes the feedback clock leading edge, at which time the PD 14 may provide a Dn signal to decrease the delay.

If the PD 14 has not acquired the Ref Clk edge (block 505), the PD 14 may be configured to provide an Up signal to increase the delay until the Ref Clk leading edge passes the feedback clock leading edge. However, if the PD 14 detects the Ref Clk edge (block 505), the PD 14 begins sending a Dn signal and the step size controller 20 changes the step size to a smaller delay value such as one delay, for example. The DLL controller 24 receives the new step size and the Dn signal (block 507). The DLL controller 24 calculates the new delay values and sends them to the update unit 18 (block 509).

Until the PD 14 sees for the Ref Clk edge again, it may continue to send the Dn signal, at which time it may send the Up signal. As described above, when lock is achieved, the PD 14 may begin alternatingly outputting Up and Dn signals, and the sampler 22 may reduce the effects of this oscillatory effect by storing samples of the Up/Dn signal. Accordingly, if lock is not achieved (block 511), the DLL controller may continue to reduce the delay value while receiving a Dn signal as described in block 509. However, once lock is achieved (block 511), the DLL controller 24 may calculate and send delay values that may maintain lock to the update unit (block 513). More particularly, in one embodiment, once lock is established the DLL controller 24 may recalculate the delay values such that the total delay for the delay line 17 may be distributed as equally as possible among the delay blocks 16. As such, the output taps from Out 1, Out 2, Out 3, and the feedback clock may have a balanced delay. For example, Out 1 may have a 90 degree phase shift from the Ref Clk, while the Out 2 may have a 180 degree phase shift and so on. However, any distribution of the delay across the delay line 17 is possible and contemplated. The update unit 18 may send the new delay values to the delay blocks synchronously as described above.

As long as lock is maintained, there may be no update of the delay values (block 517). In one embodiment, the DLL controller 24 may not provide new values to the update unit 18, and so the update unit 18 may not send new update values to the delay blocks 16. In another embodiment, the DLL controller 24 may simply resend the last calculated delay values to the update unit 18 and the update unit 18 may resend those delay values. In yet another embodiment, the update unit 18 may resend simply send the delay values that are stored within an internal register set (not shown) each update cycle, regardless of whether the delay values have been updated. If lock is lost (block 515), the DLL controller 24 may receive new Up/Dn signals (block 519). Accordingly, operation may proceed as described in the description of block 513.

It is noted that as described above, in one embodiment, each of the operations described above may be performed by the corresponding component only when that component receives its associated clock from the CLK gen unit 13. It is also noted that the operations shown in FIG. 5 are shown in a particular order for exemplary purposes only and that it is contemplated that in other embodiments, the order of the operations, and/or portions of the operations may be performed in a different order.

Figure 6:
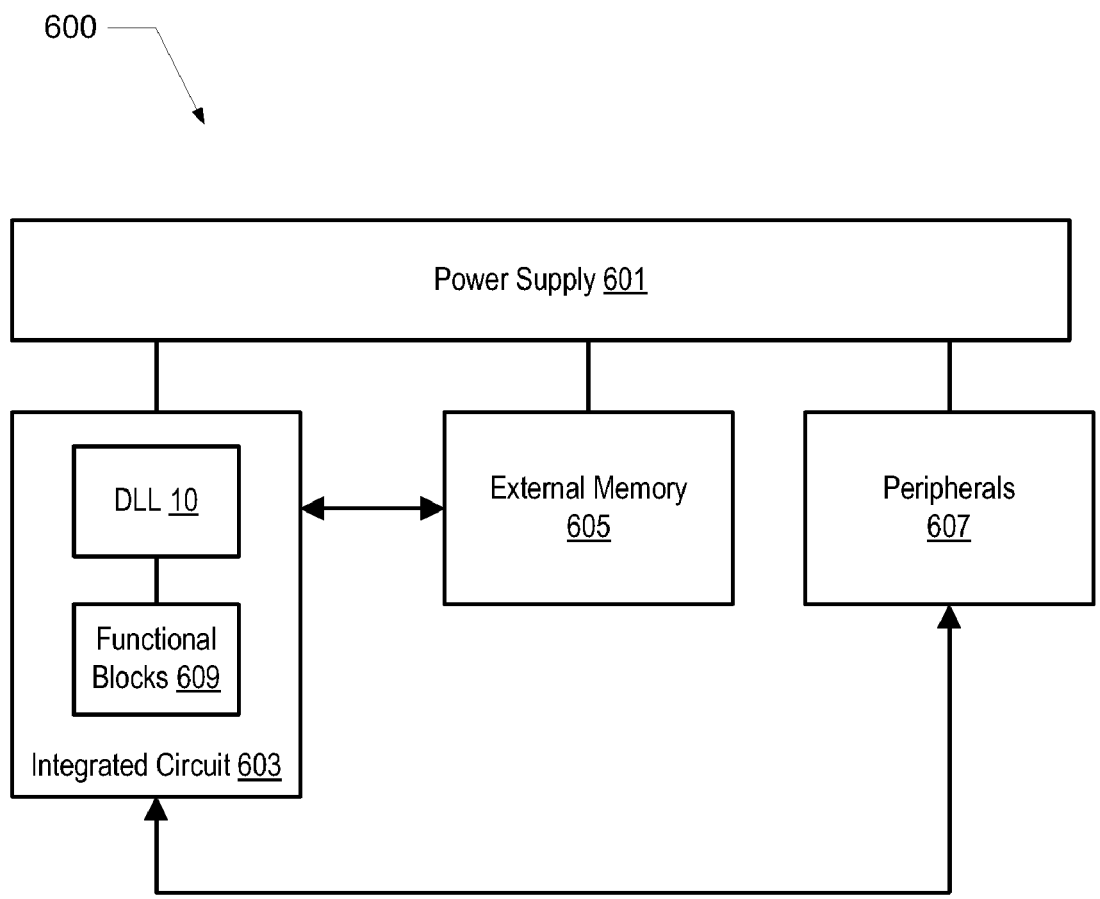
FIG. 6 is a block diagram of one embodiment of a system that includes an integrated circuit having an embodiment of the delay locked loop of FIG. 1.

Turning to FIG. 6 a block diagram of one embodiment of a system that includes an integrated circuit having an embodiment of the delay locked loop of FIG. 1 is shown. The system 600 includes at least one instance of an integrated circuit 603 coupled to one or more peripherals 607 and an external memory 605. A power supply 601 is also provided which supplies the supply voltages to the integrated circuit 603 as well as one or more supply voltages to the memory 605 and/or the peripherals 607. In some embodiments, more than one instance of the integrated circuit 603 may be included (and more than one external memory 605 may be included as well).

As shown, the integrated circuit may include at least one instance of the DLL 10 of FIG. 1. In addition, the integrated circuit may include other functional blocks 609 which perform various functions as desired. In various embodiments, the DLL 10 may be used in a variety of applications. For example, the Ref Clk signal shown and described throughout this description may be any type of signal in which the phase alignment and/or recovery may be critical.

The peripherals 607 may include any desired circuitry, depending on the type of system 600. For example, in one embodiment, the system 600 may be a mobile device (e.g. personal digital assistant (PDA), smart phone, etc.) and the peripherals 607 may include devices for various types of wireless communication, such as WiFi, Bluetooth, cellular, global positioning system, etc. The peripherals 607 may also include additional storage, including RAM storage, solid state storage, or disk storage. The peripherals 607 may include user interface devices such as a display screen, including touch display screens or multitouch display screens, keyboard or other input devices, microphones, speakers, etc. In other embodiments, the system 600 may be any type of computing system (e.g. desktop personal computer, laptop, workstation, net top etc.).

The external memory 605 may include any type of memory. For example, the external memory 605 may be SRAM, dynamic RAM (DRAM) such as synchronous DRAM (SDRAM), double data rate (DDR, DDR2, DDR3, etc.), low power DDR (LPDDR), LPDDR2, SDRAM, RAMBUS DRAM, etc. The external memory 605 may include one or more memory modules to which the memory devices are mounted, such as single inline memory modules (SIMMs), dual inline memory modules (DIMMs), etc.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A delay device comprising:
a plurality of delay elements, each including a delay unit, an element input, an element output, a next element output, and an element return path;
wherein the plurality of delay elements is coupled together in a chain between a device input and a device output such that the device input is coupled to the element input of a first delay element in the chain and the device output is coupled to the element output of the first delay element;
wherein the next element output of the first delay element is coupled to the element input of a next delay element in the chain, and the element output of the next delay element is coupled to the element return path of a previous delay element in the chain;
wherein one or more of the plurality of delay elements includes a NAND-gate configured to pass the input signal received at the element input to the next element output, and one or more remaining ones of the plurality of delay elements includes a NOR-gate configured to pass the input signal received at the element input to the next element output, and wherein the plurality of delay elements are alternatingly coupled together in the chain such that a delay element with a NAND-gate is coupled to a delay element with a NOR-gate; and
a decoder unit configured to provide a respective selection control signal to each of the plurality of delay elements based upon a received delay control signal;
wherein in response to the respective selection control signal each delay element is configured to selectively route a signal from the element input to one of the next element output or to the element output.

2. The delay device as recited in claim 1, wherein the next element output of a last delay element in the chain is coupled to the element return path of the last delay element.

3. The delay device as recited in claim 1, wherein each delay element includes an element decoder configured to provide control signals corresponding to the respective selection control signal to route the input signal within the delay element.

4. The delay device as recited in claim 3, wherein the delay unit of each delay element is programmable and configured to provide one of a plurality of delays dependent upon the control signals provided by the element decoder.

5. The delay device as recited in claim 4, wherein the delay unit includes a plurality of inverters coupled together in parallel, wherein control signals corresponding to the respective selection control signal increase and decrease the delay provided by the delay unit by causing one or more of the plurality of inverters to be disabled and enabled, respectively.

6. The delay device as recited in claim 1, wherein in response to the respective selection control signal, each delay element is further configured to selectively route the signal received at the element return path to the element output.

7. The delay device as recited in claim 6, wherein each of the plurality of delay elements includes a multiplexer configured to selectively route to the element output one of the signal received at the element return path or the signal received at the output of the delay unit.

8. A delay locked loop (DLL) unit comprising:
a delay line including one or more delay blocks coupled together in a series chain, wherein the delay line is coupled to receive a reference clock and to provide a delayed version of the reference clock as a feedback clock;
wherein each of the delay blocks includes:
a plurality of delay elements, each including a delay unit, an element input, an element output, a next element output, and an element return path;
wherein the plurality of delay elements is coupled together in a chain between a device input and a device output such that the device input is coupled to the element input of a first delay element in the chain and the device output is coupled to the element output of the first delay element;
wherein the next element output of the first delay element is coupled to the element input of a next delay element in the chain, and the element output of the next delay element is coupled to the element return path of a previous delay element in the chain;
wherein one or more of the plurality of delay elements includes a NAND-gate configured to pass the input signal received at the element input to the next element output, and one or more remaining ones of the plurality of delay elements includes a NOR-gate configured to pass the input signal received at the element input to the next element output, and wherein the plurality of delay elements are alternatingly coupled together in the chain such that a delay element with a NAND-gate is coupled to a delay element with a NOR-gate; and a decoder unit configured to provide a respective selection control signal to each of the plurality of delay elements based upon a received delay control signal;

wherein in response to the respective selection control signal each delay element is configured to selectively route the clock signal from the element input to one of the next element output or to the element output;

a controller coupled to the delay line and configured to determine a respective delay value for each of the one or more delay blocks dependent upon an output signal of a phase detector.

9. The DLL as recited in claim 8, wherein each of the plurality of delay elements includes a multiplexer configured to select, as an output to the second output, between a an output of the delay unit, and the signal received at a second input in response to the respective control signal from the decoder.

10. A delay element comprising:
a decoder unit configured to provide respective control signals to route signals within the delay element based upon a received selection signal;

wherein the decoder unit is configured to provide a first respective control signal to route a signal received at a first input to a first output through a logic gate in response to a first particular received selection signal, and to provide a second respective control signal to route to a second output a signal received at a second input in response to the first particular received selection signal;

a delay unit configured to provide a delayed version of the signal received at the first input, wherein an amount of delay is selectable by a third respective control signal received from the decoder unit;

wherein the decoder unit is further configured to provide a fourth respective control signal to route to the second output the delayed version of the signal received at the first input in response to a second particular received selection signal.

11. The delay element as recited in claim 10, further comprising a multiplexer configured to select, as an output to the second output, between the delayed version of the signal received at the first input and the signal received at a second input in response to the second and fourth respective control signals.

12. The delay element as recited in claim 10, wherein the logic gate comprises a NAND-gate having a first gate input coupled to the first input and a second gate input coupled to the first respective control signal, and an output coupled to the first output.

13. The delay element as recited in claim 10, wherein the logic gate comprises a NOR-gate having a first gate input coupled to the first input and a second gate input coupled to the first respective control signal, and an output coupled to the first output.

14. The delay element as recited in claim 10, wherein the delay unit includes a plurality of inverters coupled together in parallel, wherein the third respective control signal increases and decreases the delay provided by the delay unit by disabling and enabling one or more of the plurality of inverters, respectively.

15. An integrated circuit comprising:
a delay locked loop unit that includes:
one or more delay blocks coupled together in a series chain to form a delay line, wherein a first delay block in the series chain is coupled to receive a reference clock;
wherein each delay block includes:
a plurality of delay elements, each including a delay unit, an element input, an element output, a next element output, and an element return path;
wherein the plurality of delay elements is coupled together in a chain between a device input and a device output such that the device input is coupled to the element input of a first delay element in the chain and the device output is coupled to the element output of the first delay element;
wherein the next element output of the first delay element is coupled to the element input of a next delay element in the chain, and the element output of the next delay element is coupled to the element return path of a previous delay element in the chain;
wherein one or more of the plurality of delay elements includes a NAND-gate configured to pass the input signal received at the element input to the next element output, and one or more remaining ones of the plurality of delay elements includes a NOR-gate configured to pass the input signal received at the element input to the next element output, and wherein the plurality of delay elements are alternatingly coupled together in the chain such that a delay element with a NAND-gate is coupled to a delay element with a NOR-gate; and
a decoder unit configured to provide a respective selection control signal to each of the plurality of delay elements based upon a received delay control signal;
wherein in response to the respective selection control signal each delay element is configured to selectively route the clock signal from the element input to one of the next element output or to the element output.

* * * * *